(12) United States Patent  
Shur et al.

(10) Patent No.: US 7,268,375 B2  
(45) Date of Patent: Sep. 11, 2007

(54) INVERTED NITRIDE-BASED SEMICONDUCTOR STRUCTURE

(75) Inventors: Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 259 days.

(21) Appl. No.: 10/974,512

(22) Filed: Oct. 26, 2004

(65) Prior Publication Data

US 2005/0087752 A1    Apr. 28, 2005

Related U.S. Application Data

(60) Provisional application No. 60/514,630, filed on Oct. 27, 2003.

(51) Int. Cl.
*H01L 29/778* (2006.01)

(52) U.S. Cl. ............... 257/194; 257/24; 257/E29.246; 257/E29.247

(58) Field of Classification Search ............... 257/194
See application file for complete search history.

(56) References Cited

U.S. PATENT DOCUMENTS 6,624,452 B2*  9/2003  Yu et al. .................. 257/194
6,727,531 B1*  4/2004  Redwing et al. ......... 257/194
2001/0015446 A1*  8/2001  Inoue et al. .............. 257/192
2006/0113564 A1*  6/2006  Kohn et al. .............. 257/192

OTHER PUBLICATIONS

"RESURF AlGaN/GaN HEMT for High Voltage Power Switching", Karmalkar et al., IEEE Electron Device Letters, vol. 22, No. 8, Aug. 2001, pp. 373-375.
"Accumulation hole layer in p-GaN/AlGaN heterostructures", Shur et al., Applied Physics Letters, vol. 76, No. 21, May 22, 2000, pp. 3061-3063.
"Inverted GaAs/AlGaAs Modulation-Doped Field-Effect Transistors with Extremely High Transconductances", Cirillo et al., IEEE Electron Device Letters, vol. 7, Feb. 1986, 71-74.
"AlGaN/GaN-heterojunction FET with inverted 2DEG Channel", Mokerov et al., Proceedings of the 11th GaAs symposium, pp. 301-304, Munich, Oct. 2003.

* cited by examiner

*Primary Examiner*—Jerome Jackson
(74) *Attorney, Agent, or Firm*—Hoffman, Warnick & D'Alessandro, LLC

(57) ABSTRACT

A nitride-based semiconductor structure is provided. The structure includes an active layer that comprises an inverted quantum well structure that includes Indium and Nitrogen. The structure can be used to create a field effect transistor. In this case, the active layer forms an inverted active device channel. By including Indium and forming the inverted active device channel, a device having improved performance characteristics can be manufactured. Further, additional improvements, such as one or more additional layers, a second gate contact, and/or one or more field plates can be included in the device to obtain the desired performance characteristics.

9 Claims, 3 Drawing Sheets

INVERTED NITRIDE-BASED SEMICONDUCTOR STRUCTURE

REFERENCE TO PRIOR APPLICATION

The current application claims priority to provisional application Ser. No. 60/514,630, filed on Oct. 27, 2003 and hereby incorporated herein by reference.

BACKGROUND OF THE INVENTION

1. Technical Field

The invention relates generally to nitride-based semiconductor structures, and more particularly to an inverted nitride-based semiconductor structure in which the active layer comprises Indium.

2. Background Art

To date, a typical nitride-based semiconductor, such as a modulation-doped field effect transistor (FET) and the like, has a "normal" metal-AlGaN-GaN structure. In this case, the AlGaN layer is deposited on top of an undoped GaN layer, and the device channel is in the GaN layer at the AlGaN-GaN heterointerface. As a result, the distance between the two-dimensional (2-D) electron gas in the device channel and the metal is equal to the thickness of the AlGaN layer plus the effective thickness of the device channel.

For various types of semiconductor structures, such as an arsenic-based heterostructure FET, a higher transconductance can be obtained by inverting an AlGaAs-GaAs heterostructure. In this case, the "normal" metal-AlGaAs-GaAs structure is altered to metal-GaAs-AlGaAs, while the device channel is formed in the GaAs layer at the AlGaAs-GaAs heterointerface. To this extent, the distance between the 2-D electron gas in the device channel and the metal is equal to the thickness of the GaAs layer minus the effective thickness of the device channel. As a result, for a comparable structure, the 2-D electron gas is closer to the gate than in the normal structure thereby providing a higher transconductance.

Due to a high breakdown field, nitride-based semiconductor devices are desirable over other types of devices (e.g., arsenic-based semiconductor devices) for applications that require high voltage, high power, and the like. Additionally, other improvements, such as the inclusion of two field plates, can be implemented to significantly improve the breakdown voltage in Reduced Surface Field (RESURF) devices. To provide for a higher transconductance in nitride-based semiconductor structures, an AlGaN-GaN inverted structure has been developed, and a nitride-based FET has been developed which includes an AlGaN-GaN heterojunction with the inverted 2-D channel. However, this device exhibited operational characteristics that were not superior to those of a normal AlGaN-GaN heterostructure FET. In particular, since the device required a conventional buffer layer to avoid a dislocation formation, the quality of the materials was insufficient to demonstrate an improved performance.

As a result, a need exists for an improved nitride-based semiconductor structure in which an inverted channel design can be effectively incorporated to achieve a higher transconductance for a resulting device. The structure can be used to create a device, such as a FET, having improved performance characteristics.

SUMMARY OF THE INVENTION

The invention provides an improved nitride-based semiconductor structure. Specifically, under the present invention, the structure includes an active layer that comprises Indium and Nitrogen and forms an inverted active device channel. By including Indium and forming the inverted active device channel, the structure provides improved performance characteristics for a device. Various devices, such as field effect transistors (FETs), can be made using the structure. Further, additional device design improvements, such as one or more additional layers, a second gate contact, and/or one or more field plates can be included in the device to obtain the desired performance characteristics. Still further, one or more additional group III elements can be included in the active layer.

A first aspect of the invention provides a nitride-based semiconductor structure comprising: a substrate; an active layer above the substrate, wherein the active layer comprises an inverted quantum well structure that includes Indium and Nitrogen.

A second aspect of the invention provides a nitride-based semiconductor structure comprising: a substrate; a first layer above the substrate, wherein the first layer comprises Nitrogen and at least one group III element; an active layer on the first layer, wherein the active layer comprises an inverted quantum well structure that includes Indium and Nitrogen; and a first contact above the active layer.

A third aspect of the invention provides a nitride-based field effect transistor comprising: a substrate; an active layer above the substrate, wherein the active layer comprises an inverted active device channel, and wherein the active layer comprises Indium and Nitrogen; a gate contact above the active layer; a source contact above the substrate and adjacent to the active layer; and a drain contact above the substrate and adjacent to the active layer.

A fourth aspect of the invention provides a method of manufacturing the various structures and devices described herein.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

It is understood, that for purposes of this description Al means Aluminum, Ga means Gallium, N means Nitrogen, In means Indium, Si means Silicon, O means Oxygen, and C means Carbon. Further, it is understood that "group III elements" comprise the elements Al, Ga, In, Boron (B), and Thallium (Tl).

As indicated above, the invention provides an improved nitride-based semiconductor structure. Specifically, under the present invention, the structure includes an active layer that comprises Indium and Nitrogen and forms an inverted active device channel. By including Indium and forming the inverted active device channel, the structure provides improved performance characteristics for a device. Various devices, such as field effect transistors (FETs), can be made using the structure. Further, additional device design improvements, such as one or more additional layers, a second gate contact, and/or one or more field plates can be included in the device to obtain the desired performance characteristics. Still further, one or more additional group III elements can be included in the active layer.

Figure 1:
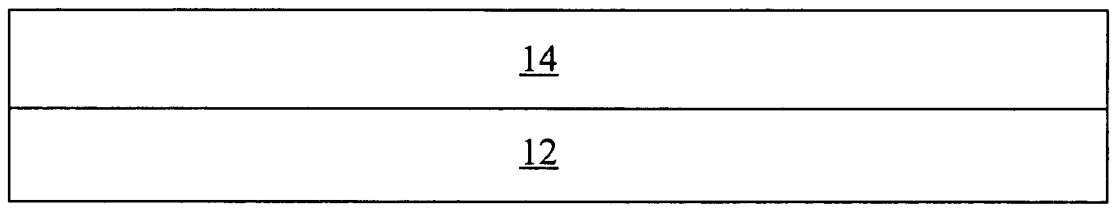
FIG. 1 shows an illustrative nitride-based semiconductor structure according to one embodiment of the invention.

Turning to the drawings, FIG. 1 shows an illustrative nitride-based semiconductor structure 10. Semiconductor structure 10 is shown including a substrate 12 and an active layer 14 disposed above substrate 12. In one embodiment, substrate 12 comprises bulk AlN. However, it is understood that substrate 12 could comprise any of various other types of substrate including sapphire, silicon carbide (SiC), spinel, silicon, bulk GaN, and bulk AlGaN. Active layer 14 comprises an inverted quantum well structure that includes In and N in at least one sub-layer, and which when used to create a FET, forms an inverted active device channel. In alternative embodiments of the invention, one or more sub-layers of active layer 14 can comprise N with one or more group III elements such as Al, Ga, and In. For example, active layer 14 can comprise one or more sub-layers of GaN, AlGaN, InGaN, InN, $Al_yIn_{1-y}GaN$, where y is greater than zero and less than one, etc. To this extent, one embodiment of structure 10 comprises a substrate comprising bulk $Al_yGa_{1-y}N$ (0<y<1) having an active layer 14 comprising $Al_{1-x}In_xN$ (0.0001≦x≦1) layer formed thereon. In another embodiment of structure 10, active layer 14 can comprise an $Al_{1-x-y}Ga_yIn_xN$ layer in which the molar fraction of In varies from 0.0001 to 1-y and the molar fraction of Ga varies from 0.9999 to zero.

It is understood that active layer 14 and/or additional layers discussed herein can be deposited directly on an adjacent, lower layer (e.g., substrate 12) or one or more additional layers can be formed between the two adjacent layers shown. The composition and configuration of any additional layers and/or components can vary depending on the desired functionality of a device formed using semiconductor structure 10 and/or any improvements made to enhance the operation and/or reliability of the device. Further, each layer can be formed over all or only a portion of a lower layer, can vary in thickness, and can be formed into any pattern that provides the desired functionality for the resulting device.

In one embodiment of the invention, a method of creating the structures/devices discussed herein is provided wherein each layer (e.g., active layer 14) is deposited on an adjacent layer using the solution disclosed in the co-pending U.S. patent application Ser. No. 10/713,326 filed on Nov. 14, 2003, and entitled "Methods of Growing Nitride-Based Film Using Varying Pulses," which is hereby incorporated herein by reference. However, it is understood that each layer can be deposited and/or patterned using any solution now known or later developed. For example, each nitride-based layer can be formed using Molecular Beam Epitaxy (MBE), Metal Organic Chemical Vacuum Deposition (MOCVD), and/or patterned using selective etching. To this extent, each contact, gate, field plate, etc., discussed herein can be applied to the structure/device using any known solution.

Figure 2:
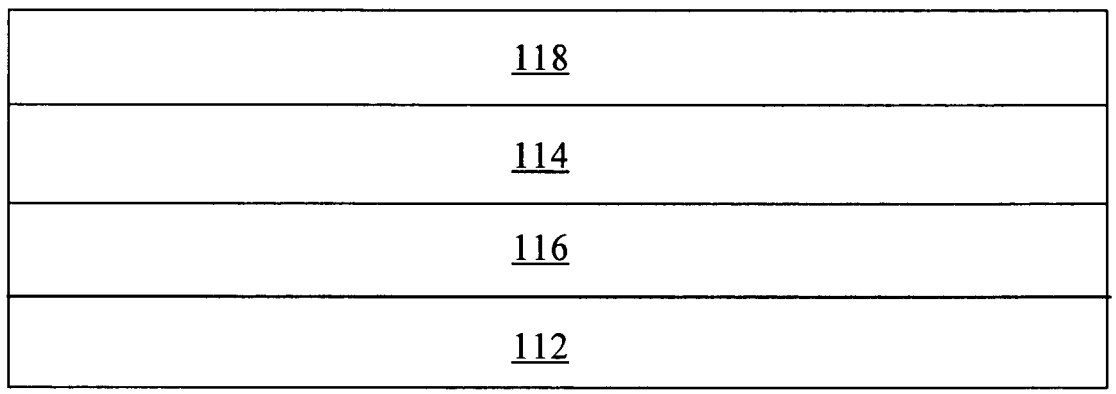
FIG. 2 shows an alternative nitride-based semiconductor structure according to another embodiment of the invention.

As mentioned above, various additional layers can be included in structure 10. For example, FIG. 2 shows an alternative structure 110 that includes a substrate 112, a first layer 116 above substrate 112, an active layer 114 above first layer 116, and a second layer 118 above active layer 114. Various combinations of content can be used for each of the layers in structure 110. In one embodiment, substrate 112 can comprise bulk AlN and active layer 114 comprises at least In from the group III elements and N.

First layer 116 also can include one or more of the group III elements and N. For example, first layer 116 can comprise AlInGaN, AlN, $Al_yIn_{1-y}GaN$ (0≦y≦1), etc. In one embodiment, first layer 116 can comprise AlInGaN with a delta doping layer. Similarly, second layer 118 can include one or more of the group III elements and N. For example, second layer 118 can comprise GaN, $Al_yIn_{1-y}GaN$ (0≦y≦1), etc. Further, second layer 118 can comprise a dielectric layer such as one or more layers of $SiO_2$, and/or SiN. In one embodiment of the invention, each layer 114, 116, 118 is deposited on the adjacent layer shown. However, it is understood that structure 110 is only illustrative. To this extent, structures under the invention can comprise one or more additional layers and/or be manufactured without first layer 116 and/or second layer 118.

Figure 3:
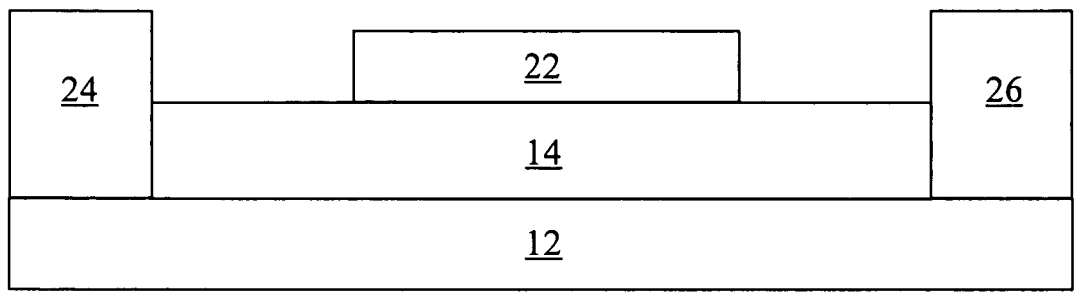
FIG. 3 shows an illustrative field effect transistor (FET) according to one embodiment of the invention.

In any event, various devices can be manufactured that comprise structure 10 (FIG. 1), structure 110 (FIG. 2) or some variation thereof. In each case, active layer 114 will comprise an inverted quantum well structured that includes In and N. For example, FIG. 3 shows an illustrative field effect transistor (FET) 20 (e.g., inverted channel high electron mobility transistor) according to one embodiment of the invention. FET 20 is shown including substrate 12 and active layer 14 as shown and discussed with respect to FIG. 1. In this case, active layer 114 will form an inverted active device channel for the device. Further, FET 20 is shown including a gate contact 22 (e.g., a Schottky contact), source contact 24, and drain contact 26. Gate contact 22 can be formed on active layer 14, while source contact 24 and drain contact 26 are located over substrate 12 and adjacent to active layer 14. In one embodiment of FET 20, substrate 12 comprises bulk AlN, while active layer 14 comprises InGaN.

Figure 4:
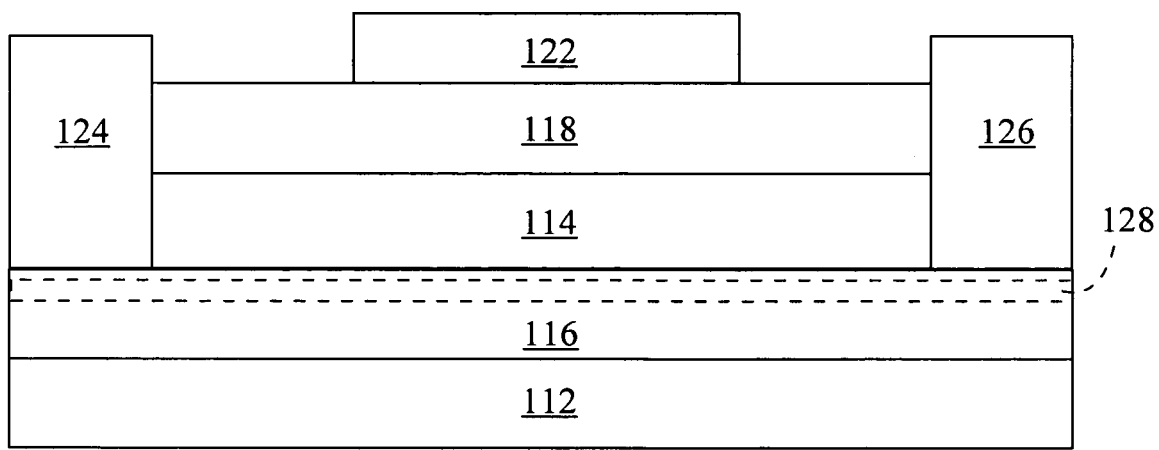
FIG. 4 shows an illustrative FET according to another embodiment of the invention.

FIG. 4 shows an alternative FET 120 that comprises the structure 110 shown and discussed with reference to FIG. 2. To this extent, FET 120 is shown including a substrate 112, a first layer 116, an active layer 114, and a second layer 118. Further, FET 120 includes a gate contact 122 formed on second layer 118 and a source contact 124 and a drain contact 126 each formed on first layer 116 and adjacent to active layer 114 and second layer 118. In one embodiment of FET 120, substrate 112 comprises bulk AlN, first layer 116 comprises AlInGaN with or without a delta doping layer 128, active layer 114 comprises InN, and second layer 118 comprises a dielectric.

However, it is understood that various alternatives to FET 120 can be manufactured. To this extent, FET 120 can be manufactured without first layer 116. In this case, active layer 114, source contact 124 and drain contact 126 can each be formed on substrate 112. Various combinations can be incorporated for substrate 112 and layers 114, 118. For example, substrate 112 can comprise bulk AlN and active layer 114 can comprise InN, while second layer 118 can comprise a barrier layer that includes GaN, AlInGaN, a dielectric, etc.

Figure 5:
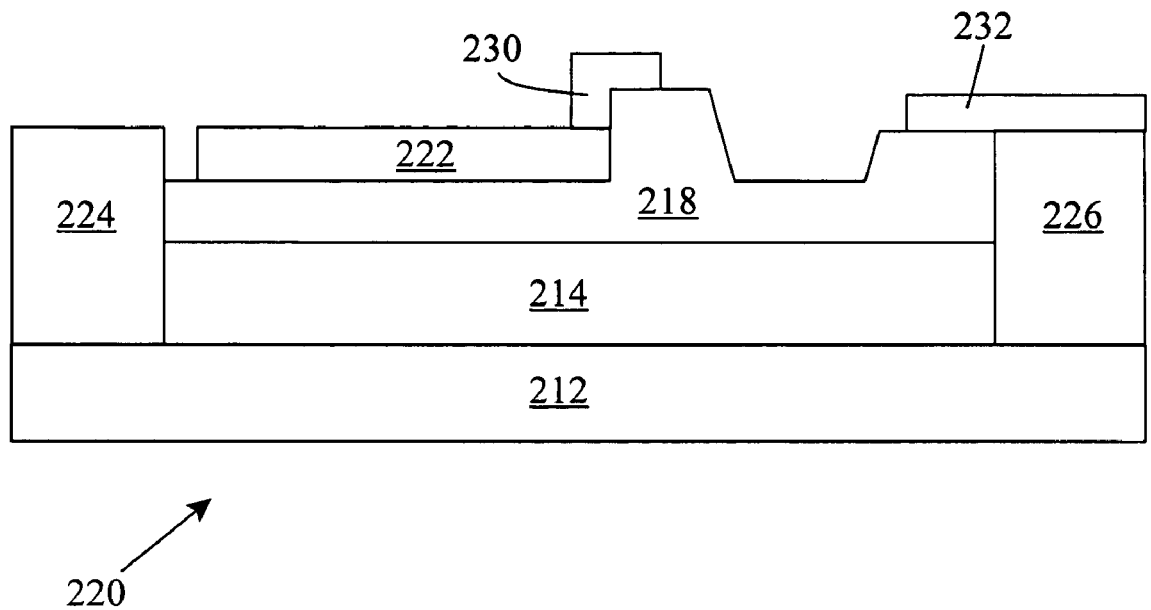
FIG. 5 shows an illustrative FET according to still another embodiment of the invention.

Additional features, structures, layers, etc., can be added to FET 120 in order to obtain a desired performance improvement. For example, FIG. 5 shows an illustrative FET 220 according to one embodiment of the invention, which comprises a substrate 212 (e.g., bulk AlN), an active layer 214 (e.g., InN), a second layer 218 (e.g., a dielectric), a gate 222, a source contact 224, and a drain contact 226. Additionally, in order to improve the breakdown voltage of FET 220, FET 220 is shown including a first field plate 230 and a second field plate 232. First field plate 230 is shown formed on a portion of the drain side of gate 222 and a portion of second layer 218, while second field plate 232 is shown formed on at least a portion of drain contact 226 and second layer 218. Each field plate 230, 232 can be formed by an extension of the metal for the corresponding gate 222 or drain contact 226. While FET 220 is shown including two field plates 230, 232, it is understood that FET 220 could be created with only one field plate, e.g., either field plate 230 or field plate 232.

Figure 6:
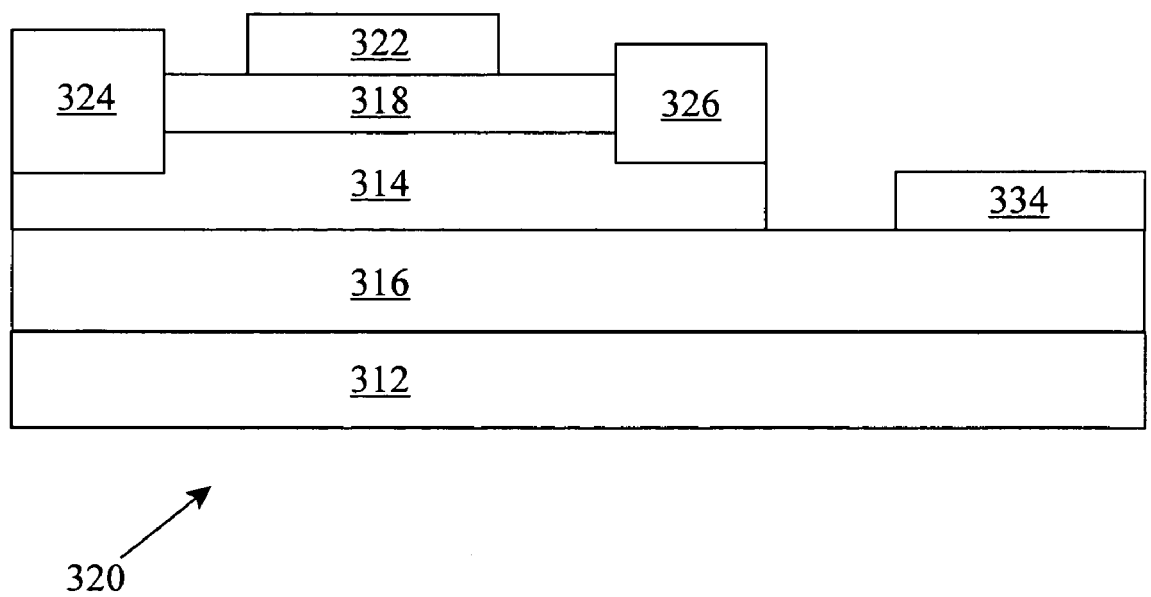
FIG. 6 shows an illustrative FET according to yet another embodiment of the invention.

FIG. 6 shows yet another illustrative FET 320 according to one embodiment of the invention, which comprises a substrate 312, a first layer 316, an active layer 314, a second layer 318, a gate contact 322 (e.g., metal), a source contact 324, and a drain contact 326. Additionally, FET 320 is shown including a second gate 334, which can be disposed below active layer 314 and can comprise a part of first layer 316. In one embodiment of FET 320, substrate 312 comprises bulk AlN, first layer 316 and second gate 334 comprise an n-type or p-type modulation doped AlInGaN epitaxial layer grown on substrate 312, active layer 314 comprises the corresponding n-type or p-type channel InGaN or InN, and second layer 318 comprises a dielectric.

In an alternative embodiment, FET 320 can be manufactured without second layer 318. In this case, gate contact 322 can be formed on active layer 314. As discussed above, second gate 334 can comprise a part of first layer 316, which can comprise an n-type or p-type AlInGaN epitaxial layer grown on substrate 312, which can comprise bulk AlN. In one embodiment, first layer 316 includes a delta doped epitaxial layer. In any event, active layer 314 can comprise the corresponding n-type or p-type channel InGaN or InN, and gate contact 322 can comprise a metal contact.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims. To this extent, the illustrative FETs shown and discussed herein can be configured to operate as any type of semiconductor device including, for example, a power switching device, a microwave device, an optoelectronic device, and an acousto-optic device.

What is claimed is:

1. A nitride-based semiconductor structure comprising:
a substrate including Aluminum and Nitrogen;
a first layer above the substrate, wherein the first layer comprises Indium and Nitrogen and at least one of Aluminum or Gallium; and
an active layer on the first layer, wherein the active layer comprises an inverted quantum well structure that includes Indium and Nitrogen.

2. The structure of claim 1, further comprising a first contact on the active layer.

3. The structure of claim 2, wherein the first contact comprises a Schottky contact.

4. The structure of claim 2, further comprising:
a source contact on the substrate; and
a drain contact on the substrate, wherein the first contact comprises a gate contact.

5. The structure of claim 2, further comprising a field plate at least partially on the first contact.

6. The structure of claim 1, wherein the active layer further comprises at least one of Aluminum or Gallium.

7. The structure of claim 1, wherein the substrate is a bulk Aluminum Nitride substrate.

8. The structure of claim 1, further comprising:
a second layer on the active layer; and
a contact on the second layer.

9. The structure of claim 8, wherein the second layer comprises at least one of GaN, AlInGaN or a dielectric.

* * * * *